(12) United States Patent
Yin et al.

(10) Patent No.: US 8,415,621 B2
(45) Date of Patent: Apr. 9, 2013

(54) METHOD FOR LINE WIDTH MEASUREMENT

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/381,074

(22) PCT Filed: Jul. 22, 2011

(86) PCT No.: PCT/CN2011/077477
§ 371 (c)(1), (2), (4) Date: Dec. 27, 2011

(87) PCT Pub. No.: WO2012/041114
PCT Pub. Date: Apr. 5, 2012

(65) Prior Publication Data
US 2012/0193531 A1 Aug. 2, 2012

(30) Foreign Application Priority Data
Sep. 29, 2010 (CN) .......................... 2010 1 0500353

(51) Int. Cl.
*G01B 15/00* (2006.01)
(52) U.S. Cl.
USPC ........... 250/307; 250/306; 250/209; 250/310; 250/311; 850/11; 850/20

(58) Field of Classification Search ................. 250/306, 250/307, 309, 310, 311; 850/11, 20
See application file for complete search history.

(56) References Cited

U.S. PATENT DOCUMENTS

| 6,225,639 | B1 * | 5/2001 | Adams et al. ............. 250/559.4 |
| 6,326,618 | B1 * | 12/2001 | Kane et al. ..................... 250/307 |
| 6,358,860 | B1 * | 3/2002 | Scheer et al. ................. 438/745 |
| 7,173,268 | B2 * | 2/2007 | Tanaka et al. ............ 250/559.19 |
| 8,072,601 | B2 * | 12/2011 | Fukuhara et al. ............. 356/401 |
| 2006/0200265 | A1 * | 9/2006 | Hsu et al. ...................... 700/121 |

FOREIGN PATENT DOCUMENTS
CN  101290457 A  10/2008

OTHER PUBLICATIONS
PCT Int'l Search Report.
PCT Written Opinion, Oct. 27, 2011.

* cited by examiner

*Primary Examiner* — Michael Logie
(74) *Attorney, Agent, or Firm* — Goodwin Procter LLP

(57) ABSTRACT

A method for line width measurement, comprising: providing a substrate, wherein a raised line pattern is formed on a surface of the substrate, and the line pattern has a width; forming a first measurement structure and a second measurement structure on opposite sidewalls of the line pattern in the width direction of the line pattern; removing the line pattern; and measuring the spacing between the first measurement structure and the second measurement structure, and obtaining the width of the line pattern by subtracting a predetermined offset from the spacing. The present invention facilitates to reduce the uncertainty associated with the measuring process and to improve the measurement precision.

16 Claims, 5 Drawing Sheets

METHOD FOR LINE WIDTH MEASUREMENT

This application is a National Phase application of and claims priority to, PCT Application No. PCT/CN2011/077477, filed on Jul. 22, 2011 and entitled "METHOD FOR LINE WIDTH MEASUREMENT," which claimed priority to Chinese Application No. 201010500353.X filed on Sep. 29, 2010. Both the PCT application and Chinese application are incorporated herein by reference in their entireties.

FIELD OF INVENTION

The present invention relates to the field of semiconductor measurement, and particularly to a method for line width measurement.

BACKGROUND OF INVENTION

In the manufacture of semiconductor devices, it is often required to measure the width of a formed line pattern, and determine whether it meets a technological requirement, to ensure device performance. For example, in the manufacture of the gate of a Metal-Oxide-Semiconductor (MOS) transistor, or the word line or bit line of a memory chip, after the corresponding pattern is formed, the width of it is measured. In the prior art, generally, a Scanning Electron Microscope (SEM) or a Transmission Electron Microscope (TEM) is used to measure the width of a line pattern. TEMs have high measurement accuracy, but require a complex and time-consuming procedure of sample preparation, which limits their usage.

FIG. 1 illustrates a conventional method for line width measurement with a cross section and corresponding topography. The method comprises: providing a substrate 10, with raised line patterns 11 and 12 formed on the surface of it; using a SEM to obtain an image containing information about the topography of the substrate 10, the line pattern 11 and the line pattern 12; then, determining the widths of the line pattern 11 and the line pattern 12 from the image. The SEM creates the image by scanning the sample's surface with a beam of electrons, and detecting and amplifying the produced signals; as a result, the sidewalls of a line pattern, e.g., the line pattern 11, appear distorted in the image, making it difficult to definitely identify the edges of the sidewalls of the line pattern 11. In the prior art, the edge is defined as a point in the image at which the magnitude is the mean of the peak and the valley. For example, the edges of the sidewalls of the line pattern 11 are defined as points L1 and L2, where the magnitude is the mean of the peak and the valley. Then, the width of the line pattern 11 is defined as the distance between the points L1 and L2. However, the points L1 and L2 are not exactly the true edges of the line pattern 11, which contributes to measurement uncertainty, and results in low precision.

When the Critical Dimension (CD) of the semiconductor device shrinks, the width of the line pattern 11 is reduced, leading to a greater measurement uncertainty and a lower precision.

SUMMARY OF INVENTION

An object of the present invention is to provide a method for line width measurement, which can reduce measurement uncertainty and improve the precision.

To solve the problems above, according to the present invention, it is provided a method for line width measurement, comprising:

providing a substrate, wherein a raised line pattern is formed on a surface of the substrate, and the line pattern has a width;

forming a first measurement structure and a second measurement structure on opposite sidewalls of the line pattern in the width direction of the line pattern;

removing the line pattern; and measuring the spacing between the first measurement structure and the second measurement structure, and obtaining the width of the line pattern by subtracting a predetermined offset from the spacing.

Optionally, the spacing between the first measurement structure and the second measurement structure is measured using a scanning electron microscope.

Optionally, forming the first measurement structure and the second measurement structure on the opposite sidewalls of the line pattern in the width direction of the line pattern comprises:

forming a measurement assisting layer covering the substrate and the line pattern; and etching-back the measurement assisting layer, so that the first measurement structure and the second measurement structure are formed on the opposite sidewalls of the line pattern in the width direction of the line pattern.

Optionally, forming the first measurement structure and the second measurement structure on the opposite sidewalls of the line pattern in the width direction of the line pattern comprises:

forming a measurement assisting layer to cover the substrate and the line pattern; and planarizing the measurement assisting layer so that a surface of the measurement assisting layer is even with a surface of the line pattern, so as to form the first measurement structure and the second measurement structure on the opposite sidewalls of the line pattern in the width direction of the line pattern.

Optionally, the predetermined offset is zero.

Optionally, the predetermined offset is determined by: measuring a width of the line pattern using a transmission electron microscope; measuring the spacing between the first measurement structure and the second measurement structure using a scanning electron microscope; and obtaining the offset by subtracting the width of the line pattern measured by the transmission electron microscope from the spacing between the first measurement structure and the second measurement structure.

Optionally, the material of the first measurement structure and the second measurement structure is different from the material of the line pattern.

Optionally, forming the first measurement structure and the second measurement structure on the opposite sidewalls of the line pattern in the width direction of the line pattern comprises:

forming a first assisting line and a second assisting line on the substrate and at opposite sides of the line pattern in the width direction of the line pattern, so that surfaces of the first assisting line and the second assisting line are even with a surface of the line pattern, and the first assisting line and the second assisting line are symmetric to each other with respect to the line pattern;

forming a measurement assisting layer on the substrate and planarizing the measurement assisting layer, so that a surface of the measurement assisting layer is even with the surface of the line pattern; and removing the first assisting line and the second assisting line, so as to form the first measurement structure and the second measurement structure on the opposite sidewalls of the line pattern in the width direction of the line pattern.

Optionally, the predetermined offset equals to a width of a portion of the measurement assisting layer between the first assisting line and the line pattern, and equals to a width of a portion of the measurement assisting layer between the second assisting line and the line pattern.

Optionally, the material of the first assisting line and the second assisting line is the same as the material of the line pattern, and the material of the measurement assisting layer is different from the material of the line pattern.

In comparison with the prior art, the technical solution of the present invention has the following advantages.

In the technical solution of the present invention, a first measurement structure and a second measurement structure are formed on opposite sidewalls of a line pattern in its width direction, then the line pattern is removed, and the width of the line pattern is obtained by subtracting a predetermined offset from a measured spacing between the first measurement structure and the second measurement structure; thus the measurement of width is translated into the measurement of spacing, which facilitates to reduce the uncertainty associated with the measuring process and to improve the measurement precision.

BRIEF DESCRIPTION OF DRAWINGS

The above and other objects, features and advantages of the present invention will become more apparent when read in conjunction with the accompanying drawings, in which the same reference numerals denote the same components. The figures are not drawn to scale, in order not to unnecessarily obscure the essence of the present invention.

DETAILED DESCRIPTION OF EMBODIMENTS

In conventional methods for line width measurement, generally, the edge of a line pattern is defined as a point in the image obtained using a scanning electron microscope where the magnitude is the mean of the peak and the valley, which contributes to measurement uncertainty, and results in low precision.

Figure 1:
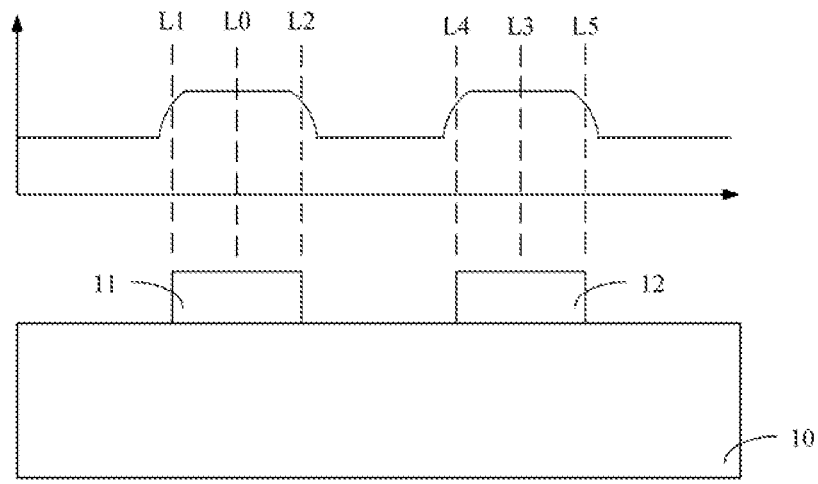
FIG. 1 illustrates a conventional method for line width measurement with a cross section and topography.

The inventors found that, by translating the measurement of width into the measurement of spacing, the uncertainty can be reduced and the precision can be improved. As shown in FIG. 1, in order to measure the spacing of the line patterns 11 and 12, the topology of the substrate 10 and the line patterns 11 and 12 is also obtained using an SEM. Then, measurement references are determined. For example, if L0, the centerline of the line pattern 11, and L3, the centerline of the line pattern 12, are used as the measurement references, then the spacing of the line patterns 11 and 12 is defined as the distance between the centerlines L0 and L3. The positions of the centerlines L0 and L3 can be determined relatively easily, resulting in small measurement uncertainty, and thus high precision. Similarly, the estimated edges L1 and L4 at the same side the line patterns 11 and 12, or, alternatively, the estimated edges L2 and L5 at the other side of the line patterns 11 and 12, may be used as the measurement references for calculating the spacing of the line patterns 11 and 12. Because the estimated positions of L1 and L4, or, alternatively, L2 and L5, are both defined as points where the magnitude is the mean of the peak and the valley, the measurement uncertainties will cancel each other out, resulting in higher precision.

In the technical solution of the present invention, a first measurement structure and a second measurement structure are formed on opposite sidewalls of a line pattern in its width direction, then the line pattern is removed, and the width of the line pattern is obtained by subtracting a predetermined offset from a measured spacing between the first measurement structure and the second measurement structure; thus the measurement of width is translated into the measurement of spacing, which facilitates reduction of the uncertainty associated with the process of measuring and improvement of the precision.

For a better understanding of the objects, features and advantages above of the present invention, the embodiments of the present invention will be described in details hereinafter with reference to the accompanying drawings.

In the following descriptions, numerous specific details are set forth in order to enable a thorough understanding of the present invention. It is apparent to those skilled in the art that the present invention can be practiced without these specific details; hence, the present invention is not limited to the embodiments disclosed herein.

Figure 2:
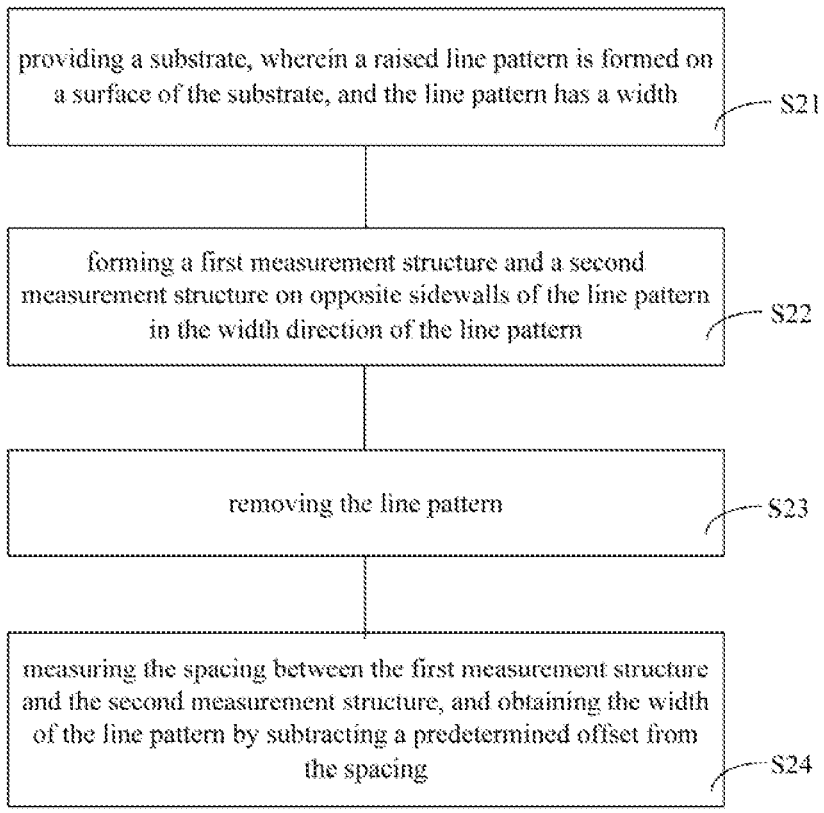
FIG. 2 is a flow chart of a method for line width measurement according to an embodiment of the present invention.

FIG. 2 is a flow chart of a method for line width measurement according to an embodiment of the present invention. As shown in FIG. 2, the method comprises:

step S21, providing a substrate, with a raised line pattern formed on a surface of the substrate, the line pattern having a width;

step S22, forming a first measurement structure and a second measurement structure on opposite sidewalls of the line pattern in its width direction;

step S23, removing the line pattern; and step S24, measuring the spacing between the first measurement structure and the second measurement structure, and obtaining the width of the line pattern by subtracting a predetermined offset from the spacing.

The embodiments of the present invention are described in details below.

First Embodiment

Figure 3:
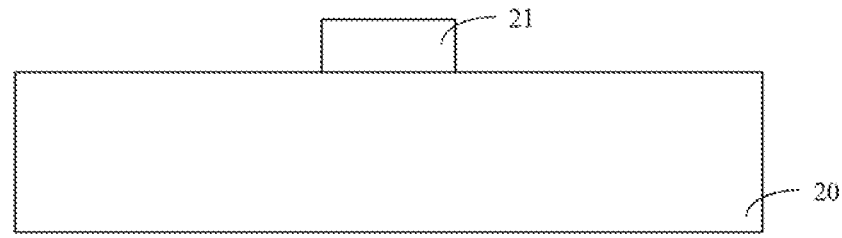
FIG. 3 to FIG. 5 are a cross-sectional view of intermediate structures formed according to a method for line width measurement according to a first embodiment of the present invention.

As shown in FIG. 3, a substrate 20 is provided, a raised line pattern 21 is formed on the surface of the substrate 20, and the line pattern 21 has a width. The material of the substrate 20 may be a semiconductor material, e.g., monocrystalline silicon, germanium, germanium silicon, or a group III-V compound; or, the substrate 20 may be a Silicon-On-Insulator (SOI) structure or comprise an epitaxial layer on silicon. The substrate may also be provided with formed semiconductor devices or interconnects. The line pattern 21 may be any structure in the manufacture of semiconductor devices, e.g., a polysilicon gate electrode in a MOS transistor, or an aluminium word line or bit line in a memory chip. In the embodiment, the line pattern 21 is a gate electrode, and the material of it is polysilicon.

Figure 4:
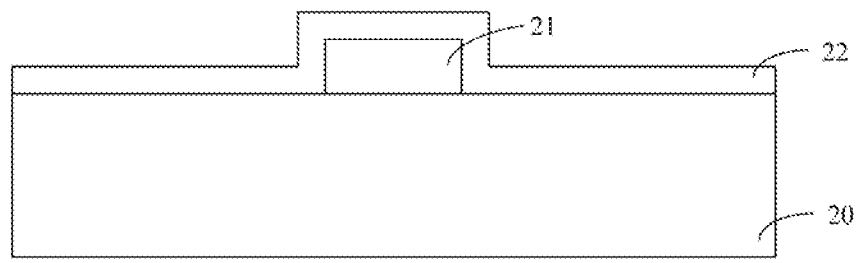

As shown in FIG. 4, a measurement assisting layer 22 is formed covering the substrate 20 and the line pattern 21. The material of the measurement assisting layer 22 may be different from the material of the line pattern 21. The material of the measurement assisting layer 22 may be silicon nitride, silicon oxide, photoresist, or the like. In the embodiment, the material of the measurement assisting layer 22 is silicon oxide, and the measurement assisting layer 22 may be formed by Chemical Phase Deposition (CVD).

Figure 5:
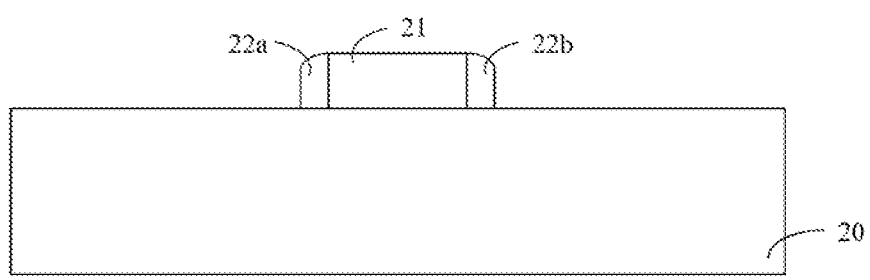

As shown in FIG. 5, the measurement assisting layer is etched back, so that a first measurement structure 22a and a second measurement structure 22b are formed on opposite sidewalls of the line pattern 21 in its width direction. The etch back is anisotropic, and does not remove the part of the measurement assisting layer that is on the sidewalls of the line structure 21, which is similar to the formation of a spacer in a MOS transistor. It is noted that, the etch back leaves a measurement assisting layer on all the sidewalls around the line pattern 21, but the first measurement structure 22a and the second measurement structure 22b are the measurement assisting layer left on the two sidewalls of the line pattern 21 in its width direction.

Figure 6:
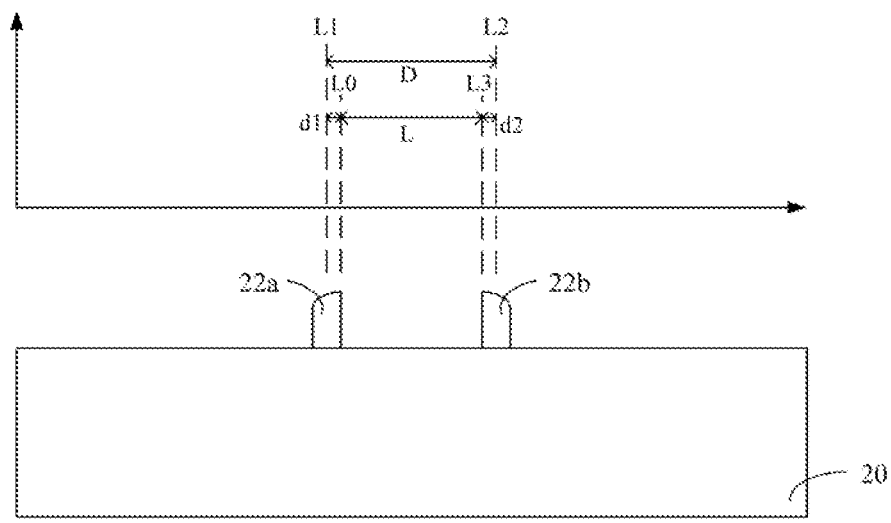
FIG. 6 is a cross-sectional view and topology of an end structure formed according to a method for line width measurement according to the first embodiment of the present invention.

As shown in FIG. 6, the line pattern is removed, the spacing between the first measurement structure 22a and the second measurement structure 22b is measured, and the width of the line pattern is obtained by subtracting a predetermined offset from the spacing. In the embodiment, the line pattern may be removed by wet etching, with an etchant Tetramethyl Ammonium Hydroxide (TMAH), which can selectively remove a polysilicon line pattern. Then, the topography of the substrate 20, the first measurement structure 22a and the second measurement structure 22b is obtained using a SEM; and L1, the centerline of the first measurement structure 22a, and L2, the centerline of the second measurement structure 22b, are used as measurement references, to determine the distance D between the centerlines L1 and L2, i.e., the spacing D between the first measurement structure 22a and the second measurement structure 22b. If the offset is set to be zero, then the width of the line pattern to be measured equals to the spacing D. As a matter of course, the left edges of the first measurement structure 22a and the second measurement structure 22b, or, alternatively, the right edges of them, may be used as the measurement references, to measure the spacing. However, the positions of the centerlines are easier to be determined, which can facilitate improvement of measurement precision. Because the measurement of the width of the line pattern is translated into the measurement of the spacing between the first measurement structure 22a and the second measurement structure 22b, the uncertainty associated with the process of measuring can be reduced and the precision can be improved.

Preferably, the offset may be determined by: before the formation of the measurement assisting layer, measuring the width of the line pattern, i.e., L in FIG. 6, using a transmission electron microscope or another apparatus or method, which can provide a width L of a higher accuracy and closer to the true width of the line pattern; then, measuring the spacing D between the first measurement structure 22a and the second measurement structure 22b using a scanning electron microscope; and subtracting the width L from the spacing D, to obtain a predetermined offset (d1+d2). Generally, the offset (d1+d2) equals to the thickness of the first measurement structure 22a in the width direction of the line pattern, and equals to the thickness of the second measurement structure 22b in the width direction of the line pattern. As a mater of course, the step of the transmission electron microscope measuring the width L may be repeated for a number of times, so as to obtain an average value.

The process for determining the offset (d1+d2) only needs to be performed once. For example, the offset (d1+d2) may be determined when the method above for width measurement is carried out for the first time; then, when the width of some other line pattern is to be measured, its width L can be obtained by subtracting the offset (d1+d2) from a spacing D between a first measurement structure 22a and a second measurement structure 22b. Because the offset (d1+d2) caused by the first measurement structure 22a and the second measurement structure 22b is removed, the error associated with the obtained width L can be reduced, and the accuracy can be improved. Moreover, the process for determining the offset (d1+d2) may be performed along with any one of the measurements that may be carried out; then, the width of a line pattern can be obtained by subtracting the obtained offset (d1+d2) from a spacing between a first measurement structure 22a and a second measurement structure 22b obtained from one or more of the measurements. Because the process for determining the offset (d1+d2) only needs to be performed once, the procedure of sample preparation for the transmission electron microscope only needs to be performed once, hence, it will have little effect on the measurements as a whole.

Second Embodiment

Figure 7:
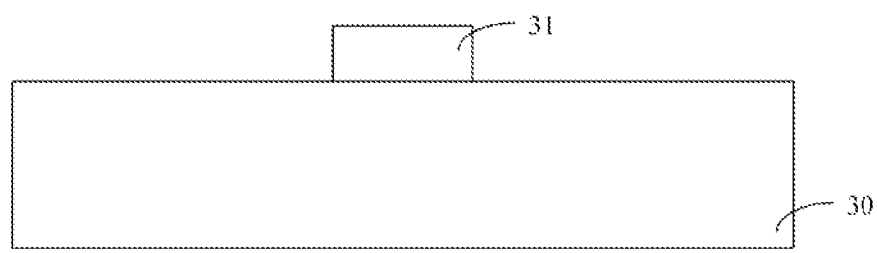
FIG. 7 to FIG. 8 are a cross-sectional view of intermediate structures formed according to a method for line width measurement according to a second embodiment of the present invention.

As shown in FIG. 7, a substrate 30 is provided, a raised line pattern 31 is formed on the surface of the substrate 30, and the line pattern 31 has a width. The material of the substrate 30 may be a semiconductor material, e.g., monocrystalline silicon, germanium, germanium silicon, or a group III-V compound; or, the substrate 30 may be a Silicon-On-Insulator (SOI) structure or comprise an epitaxial layer on silicon. The substrate may also be provided with formed semiconductor devices or interconnects. The line pattern 31 may be any structure in the manufacture of semiconductor devices, e.g., a polysilicon gate electrode in a MOS transistor, or an aluminium word line or bit line in a memory chip. In the embodiment, the line pattern 31 is a gate electrode, and the material of it is polysilicon.

Figure 8:
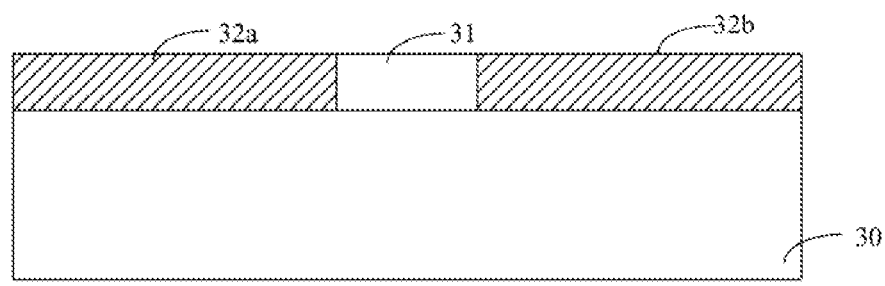

As shown in FIG. 8, a measurement assisting layer (not shown) is formed covering the substrate 30 and the line pattern 31, then, the measurement assisting layer is planarized so that the surface of the measurement assisting layer is even with the surface of the line pattern 31, to form a first measurement structure 32a and a second measurement structure 32b on opposite sidewalls of the line pattern 31 in its width direction. The material of the measurement assisting layer may be different from the material of the line pattern 31. The material of the measurement assisting layer may be silicon nitride, silicon oxide, photoresist, or the like. In the embodiment, the material of the measurement assisting layer is silicon oxide, and the measurement assisting layer may be formed by CVD. And the planarization method may be Chemical Mechanical Polishing (CMP).

Figure 9:
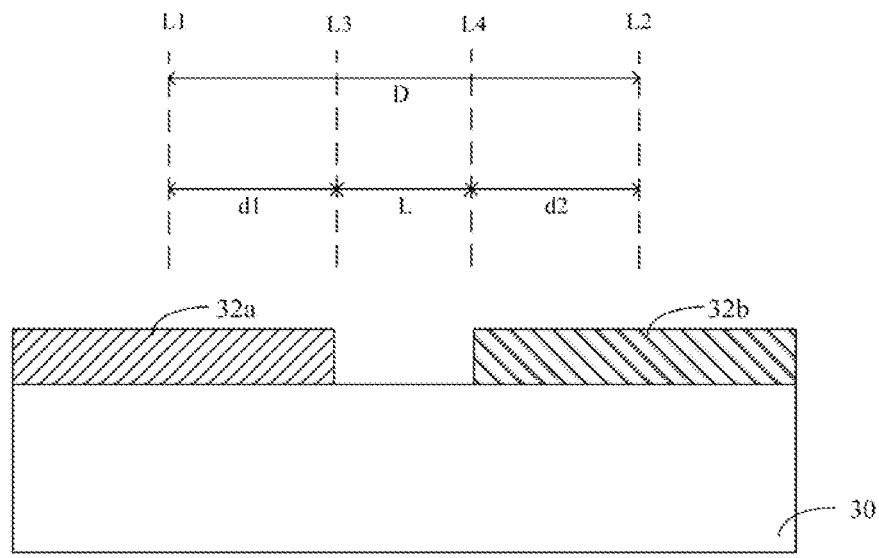
FIG. 9 is a cross-sectional view and topology of an end structure formed according to a method for line width measurement according to the second embodiment of the present invention.

As shown in FIG. 9, the line pattern is removed, the spacing between the first measurement structure 32a and the second measurement structure 32b is measured, and the width of the line pattern is obtained by subtracting a predetermined offset from the spacing. In the embodiment, the line pattern may be removed by wet etching, with an etchant Tetramethyl Ammonium Hydroxide (TMAH), which can selectively remove a polysilicon line pattern. Then, the topography of the substrate 30, the first measurement structure 32a and the second measurement structure 32b is obtained using a SEM; and L1, the centerline of the first measurement structure 32a, and L2, the centerline of the second measurement structure 32b, are used as measurement references, to determine the distance D between the centerlines L1 and L2, i.e., the spacing D between the first measurement structure 32a and the second measurement structure 32b. if the offset is set to be zero, then the width of the line pattern to be measured equals to the spacing D. As a matter of course, the left edges of the first measurement structure 32a and the second measurement structure 32b, or, alternatively, the right edges of them, may be used as the measurement references, to measure the spacing. However, the positions of the centerlines are easier to be determined, which can facilitate improvement of measurement precision. Because the measurement of the width of the line pattern is translated into the measurement of the spacing between the first measurement structure 32a and the second measurement structure 32b, the uncertainty associated with the process of measuring can be reduced and the precision can be improved.

Preferably, similarly to the first embodiment, the offset may be determined by: before the formation of the measurement assisting layer, measuring the width of the line pattern, i.e., L in FIG. 9, using a transmission electron microscope or another apparatus or method, which can provide a width 1., of a higher accuracy and closer to the true width of the line pattern; then, measuring the spacing D between the first measurement structure 32a and the second measurement structure 32b using a scanning electron microscope; and subtracting the width L from the spacing D, to obtain an offset (d1+d2). Generally, d1 equals to half the thickness of the first measurement structure 32a in the width direction of the line pattern, and d2 equals to half the thickness of the second measurement structure 32b in the width direction of the line pattern. Because the offset caused by the first measurement structure 32a and the second measurement structure 32b is removed, the error associated with the measurement can be reduced, and the accuracy can be improved.

Similarly to the first embodiment, the process for determining the offset (d1+d2) only needs to be performed once, and may be performed along with any one of the measurements that may be carried out; hence, it will have little effect on the measurements as a whole.

Third Embodiment

Figure 10:
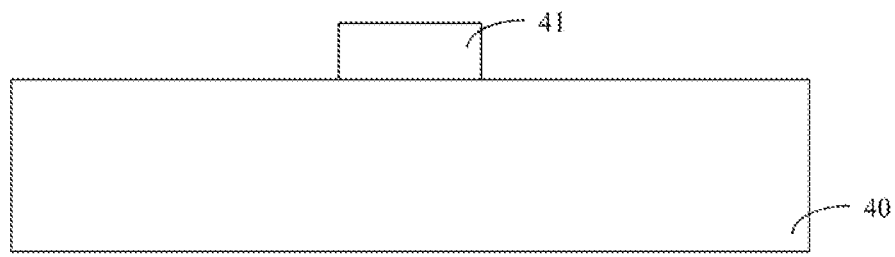
FIG. 10 to FIG. 12 are a cross-sectional view of intermediate structures formed according to a method for line width measurement according to a third embodiment of the present invention.

As shown in FIG. 10, a substrate 40 is provided, a raised line pattern 41 is formed on the surface of the substrate 40, and the line pattern 41 has a width. The material of the substrate 40 may be a semiconductor material, e.g., monocrystalline silicon, germanium, germanium silicon, or a group III-V compound; or, the substrate 40 may be a Silicon-On-Insulator (SOI) structure or comprise an epitaxial layer on silicon. The substrate may also be provided with formed semiconductor devices or interconnects. The line pattern 41 may be any structure in the manufacture of semiconductor devices, e.g., a polysilicon gate electrode in a MOS transistor, or an aluminium word line or bit line in a memory chip. In the embodiment, the line pattern 41 is a gate electrode, and the material of it is polysilicon.

Figure 11:
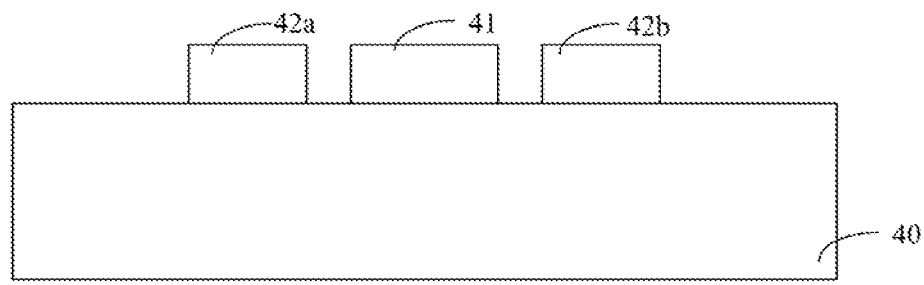

As shown in FIG. 11, a first assisting line 42a and a second assisting line 42b are formed on the substrate 40 at opposite sides of the line pattern 41 in its width direction, so that the surfaces of the first assisting line 42a and the second assisting line 42b are even with the surface of the line pattern 41, and are symmetric to each other with respect to the line pattern 41. Preferably, the material of each of the first assisting line 42a and the second assisting line 42b is the same as the material of the line pattern 41, which is polysilicon in this embodiment.

Figure 12:
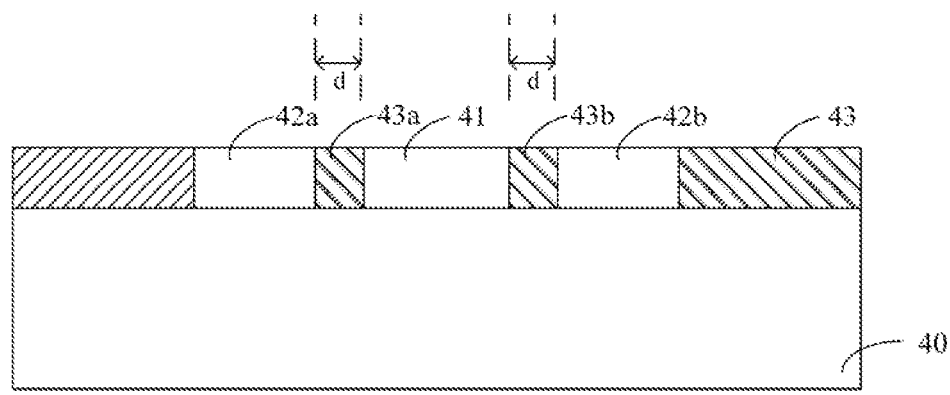

As shown in FIG. 12, a measurement assisting layer 43 is formed on the substrate 40, and is planarized so that the surface of the measurement assisting layer 43 is even with the surfaces of the line pattern 41, the first assisting line 42a and the second assisting line 42b. The material of the measurement assisting layer 43 may be different from the material of the line pattern 41. The material of the measurement assisting layer 43 may be silicon nitride, silicon oxide, photoresist, or the like. In the embodiment, the material of the measurement assisting layer 41 is silicon oxide, and the measurement assisting layer 43 may be formed by CVD. And the planarization method may be CMP. The measurement assisting layer at opposite sides of the line pattern 41 form a first measurement structure 43a and a second measurement structure 43b. In the embodiment, the width of a portion of the measurement assisting layer between the first assisting line 42a and the line pattern 41, and the width of the measurement assisting layer between the second assisting line 42b and the line pattern 41, both equal to a predetermined width d, i.e., the width of the first measurement structure 43a and the width the second measurement structure 43b both equal to the predetermined width d. For a specific measurement, the predetermined distance d has a fixed value, which is determined and can be controlled by the conditions in the formation processes (e.g., deposition and photolithography) of the first assisting line 42a and the second assisting line 42b.

Figure 13:
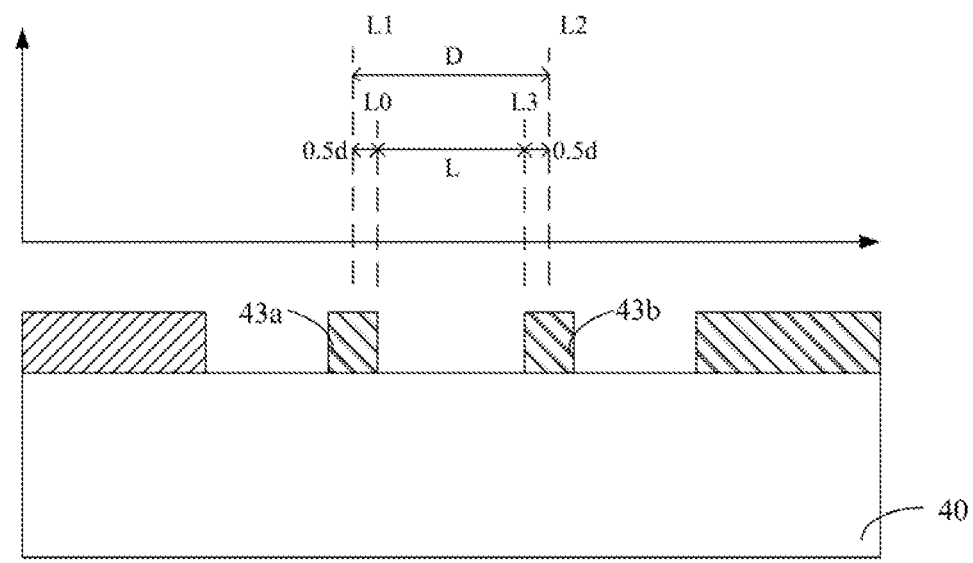
FIG. 13 is a cross-sectional view and topology of an end structure formed according to a method for line width measurement according to the third embodiment of the present invention.

As shown in FIG. 13, the line pattern, the first assisting line and the second assisting line are removed, the spacing between the first measurement structure 43a and the second measurement structure 43b is measured, and the width of the line pattern is obtained by subtracting a predetermined offset from the spacing. In the embodiment, the line pattern may be removed by wet etching, with an etchant Tetramethyl Ammonium Hydroxide (TMAH). Then, the topography of the substrate 40, the first measurement structure 43a and the second measurement structure 43b is obtained using a SEM; and L1, the centerline of the first measurement structure 43a, and L2, the centerline of the second measurement structure 43b, are used as measurement references, to determine the distance D between the centerlines L1 and L2, i.e., the spacing D between the first measurement structure 43a and the second measurement structure 43b. If the offset is set to be zero, then the width of the line pattern to be measured equals to the spacing D. As a matter of course, the left edges of the first measurement structure 43a and the second measurement structure 43b, or, alternatively, the right edges of them, may be used as the measurement references, to measure the spacing, However, the positions of the centerlines are easier to be determined, which can facilitate improvement of measurement precision. Because the measurement of the width of the line pattern is translated into the measurement of the spacing between the first measurement structure 43a and the second measurement structure 43b, the uncertainty associated with the process of measuring can be reduced and the precision can be improved.

Preferably, the obtained width of the line pattern may further be processed. As can be seen, the thickness of the first measurement structure 43a in the width direction of the line pattern, and the thickness of the second measurement structure 43b in the width direction of the line pattern, both equal to the predetermined width d. Therefore, the offset equals to the predetermined width d, and the width L of the line pattern can be obtained by subtracting the predetermined width d from the spacing D between the first measurement structure 43a and the second measurement structure 43b. Because the effect caused by the thickness of the first measurement structure 43a and the thickness of the second measurement structure 43b is removed, the error associated with the obtained width L can be reduced, and the accuracy can be improved. This embodiment does not require the process for determining the offset using a transmission electron microscope, which further shortens the time cost, and improves the efficiency.

To sum up, in the technical solution of the present invention, a first measurement structure and a second measurement structure are formed on opposite sidewalls of a line pattern in its width direction, then the line pattern is removed, and the width of the line pattern is obtained by subtracting a predetermined offset from a measured spacing between the first measurement structure and the second measurement structure; thus the measurement of width is translated into the measurement of spacing, which facilitates reduction of the uncertainty associated with the process of measuring and improvement of the precision.

Preferred embodiments of the present invention are disclosed above, which should not be interpreted as limiting the scope of the invention. Alternations and modifications can be made to the technical solution of the present invention by those skilled in the art based on the technical disclosure herein without deviation from the scope of the invention. Therefore, any alternations, equivalents, or modifications made to the embodiments disclosed herein based on the technical essence of the present invention without deviation from the scope of the invention should fall within the scope of protection of the invention.

The invention claimed is:

1. A method for line width measurement, comprising:
providing a substrate, wherein a raised line pattern is formed on a surface of the substrate, and the line pattern has a width;
forming a first measurement structure and a second measurement structure on opposite sidewalls of the line pattern in the width direction of the line pattern;
removing the line pattern; and
measuring the spacing between the first measurement structure and the second measurement structure, and obtaining the width of the line pattern by subtracting a predetermined offset from the spacing.

2. The method for line width measurement according to claim 1, wherein the spacing between the first measurement structure and the second measurement structure is measured using a scanning electron microscope.

3. The method for line width measurement according to claim 2, wherein the predetermined offset is zero.

4. The method for line width measurement according to claim 2, wherein the predetermined offset is determined by: measuring a width of the line pattern using a transmission electron microscope; measuring the spacing between the first measurement structure and the second measurement structure using a scanning electron microscope; and obtaining the offset by subtracting the width of the line pattern measured by the transmission electron microscope from the spacing between the first measurement structure and the second measurement structure.

5. The method for line width measurement according to claim 1, wherein forming the first measurement structure and the second measurement structure on the opposite sidewalls of the line pattern in the width direction of the line pattern comprises:
forming a measurement assisting layer covering the substrate and the line pattern; and
etching-back the measurement assisting layer, so that the first measurement structure and the second measurement structure are formed on the opposite sidewalls of the line pattern in the width direction of the line pattern.

6. The method for line width measurement according to claim 5, wherein the predetermined offset is zero.

7. The method for line width measurement according to claim 5, wherein the predetermined offset is determined by: measuring a width of the line pattern using a transmission electron microscope; measuring the spacing between the first measurement structure and the second measurement structure using a scanning electron microscope; and obtaining the offset by subtracting the width of the line pattern measured by the transmission electron microscope from the spacing between the first measurement structure and the second measurement structure.

8. The method for line width measurement according to claim 1, wherein forming the first measurement structure and the second measurement structure on the opposite sidewalls of the line pattern in the width direction of the line pattern comprises:
forming a measurement assisting layer to cover the substrate and the line pattern; and
planarizing the measurement assisting layer so that a surface of the measurement assisting layer is even with a surface of the line pattern, so as to form the first measurement structure and the second measurement structure on the opposite sidewalls of the line pattern in the width direction of the line pattern.

9. The method for line width measurement according to claim 8, wherein the predetermined offset is zero.

10. The method for line width measurement according to claim 8, wherein the predetermined offset is determined by: measuring a width of the line pattern using a transmission electron microscope; measuring the spacing between the first measurement structure and the second measurement structure using a scanning electron microscope; and obtaining the offset by subtracting the width of the line pattern measured by the transmission electron microscope from the spacing between the first measurement structure and the second measurement structure.

11. The method for line width measurement according to claim 1, wherein the predetermined offset is zero.

12. The method for line width measurement according to claim 1, wherein the predetermined offset is determined by: measuring a width of the line pattern using a transmission electron microscope; measuring the spacing between the first measurement structure and the second measurement structure using a scanning electron microscope; and obtaining the offset by subtracting the width of the line pattern measured by the transmission electron microscope from the spacing between the first measurement structure and the second measurement structure.

13. The method for line width measurement according to claim 1, wherein the material of the first measurement structure and the second measurement structure is different from the material of the line pattern.

14. The method for line width measurement according to claim 1, wherein forming the first measurement structure and the second measurement structure on the opposite sidewalls of the line pattern in the width direction of the line pattern comprises:

forming a first assisting line and a second assisting line on the substrate and at opposite sides of the line pattern in the width direction of the line pattern, so that surfaces of the first assisting line and the second assisting line are even with a surface of the line pattern, and the first assisting line and the second assisting line are symmetric to each other with respect to the line pattern;

forming a measurement assisting layer on the substrate and planarizing the measurement assisting layer, so that a surface of the measurement assisting layer is even with the surface of the line pattern; and removing the first assisting line and the second assisting line, so as to form the first measurement structure and the second measurement structure on the opposite sidewalls of the line pattern in the width direction of the line pattern.

15. The method for line width measurement according to claim 14, wherein the predetermined offset equals to a width of a portion of the measurement assisting layer between the first assisting line and the line pattern, and equals to a width of a portion of the measurement assisting layer between the second assisting line and the line pattern.

16. The method for line width measurement according to claim 14, wherein the material of the measurement assisting layer is different from the material of the line pattern.

* * * * *